United States Patent
Wang et al.

(10) Patent No.: US 7,496,167 B2
(45) Date of Patent: Feb. 24, 2009

(54) STORAGE EFFICIENT SLIDING WINDOW SUM

(75) Inventors: Cindy Chun Wang, Newark, CA (US); Xiangyang Simon Xu, San JOse, CA (US); Xiaochun Chen, Shanghai (CN)

(73) Assignee: Marvell World Trade Ltd., St. Michael (BB)

( * ) Notice: Subject to any disclaimer, the term of this patent is extended or adjusted under 35 U.S.C. 154(b) by 582 days.

(21) Appl. No.: 11/306,986

(22) Filed: Jan. 18, 2006

(65) Prior Publication Data

US 2006/0222137 A1    Oct. 5, 2006

Related U.S. Application Data

(60) Provisional application No. 60/645,844, filed on Jan. 20, 2005.

(51) Int. Cl.
*H04L 7/00* (2006.01)

(52) U.S. Cl. ....................................................... 375/372

(58) Field of Classification Search ................. 375/354, 375/372; 341/173
See application file for complete search history.

(56) References Cited

U.S. PATENT DOCUMENTS 5,963,602 A * 10/1999 Aoki et al. ................... 375/354
2003/0122697 A1* 7/2003 Schooler et al. ............. 341/173

* cited by examiner

*Primary Examiner*—Don N Vo

(57) ABSTRACT

A delay buffer includes a first shift register receiving input data and having a shift signal input port. The first shift register right shifts the input data responsive to a shift signal on the shift signal input port. The shift signal is determined based on an effective bit width of the input data. A first delay line receives the shifted data from the first shift register while a second delay line of equal length to the first delay line receives the shift signal. A second shift register receives the output from the first delay line and receives the output of the second delay line on a shift signal input port. The second shift register then left shifts the data contained therein according to the shift signal.

4 Claims, 4 Drawing Sheets

STORAGE EFFICIENT SLIDING WINDOW SUM

REFERENCE TO RELATED APPLICATIONS

This application claims the priority of U.S. Provisional Application Ser. No. 60/645,844 filed on Jan. 20, 2005 having the same title as the present application.

FIELD OF THE INVENTION

This invention relates generally to the field of delay buffers for communications circuitry, and more particularly, to a dual delay line using a preceding shift register employing shifting for variable bit width on the input data with the shifted data passing through a first of the delay lines and the shift value passing through the second with a following shift register receiving the data to un-shift the data based on the shift value.

BACKGROUND OF THE INVENTION

Legacy communications systems such as the Personal Handy-phone System (PHS) are configured to be simple and low cost. Differential demodulation has been adopted based on the technological constraints present at the time of designing these systems for baseband demodulation and therefore does not have the capability to combat inter-symbol-interference.

It is therefore desirable to provide a modernized baseband design compatible with or to retrofit these legacy systems. It is further desirable to employ advanced DSP algorithms and introduce adaptive equalization to realize coherent demodulation. In such systems the use of delay buffers is required to allow calculation of frequency offset data or rotation angles for correction of the demodulated data. It is also desirable to improve the storage efficiency of these delay buffers to reduce size and power requirements.

SUMMARY OF THE INVENTION

A delay buffer employing the present invention includes a first shift register receiving input data and having a shift signal input port. The first shift register right shifts the input data responsive to a shift signal on the shift signal input port. The shift signal is determined based on an effective bit width of the input data. A first delay line receives the shifted data from the first shift register while a second delay line of equal length to the first delay line receives the shift signal. A second shift register receives the output from the first delay line and receives the output of the second delay line on a shift signal input port. The second shift register then left shifts the data contained therein according to the shift signal.

BRIEF DESCRIPTION OF THE DRAWINGS

These and other features and advantages of the present invention will be better understood by reference to the following detailed description when considered in connection with the accompanying drawings wherein.

DETAILED DESCRIPTION OF THE INVENTION

The present invention is defined for an exemplary embodiment employed with a carrier offset calculator used in combination with a burst detector for carrier recovery in a PHS communication system and standard (a 2G legacy mobile system). An exemplary demodulation system in which the present invention is employed is disclosed in copending patent application Ser. No. 60/693,457, entitled FAST CONVERGENCE ADAPTIVE EQUALIZATION IN PHS BASEBAND DEMODULATION filed on Jun. 22, 2005, the disclosure of which is incorporated as though fully set forth herein.

Figure 1:
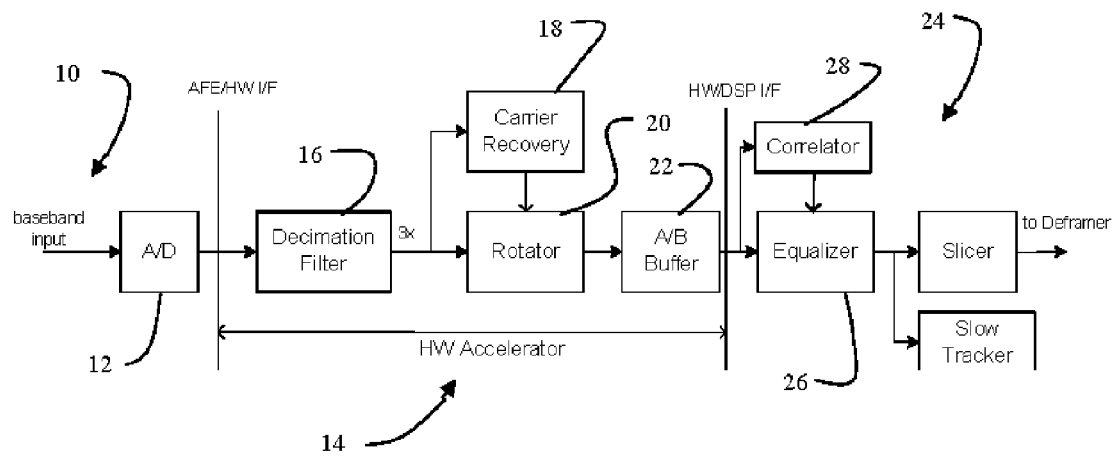
FIG. 1 is a block diagram of a communications system data path in which the current invention is employed.

As shown in FIG. 1, the analog front-end (AFE) section 10 includes an analog to digital converter 12 to convert the signal from analog to digital. To improve receiver performance, the AFE includes an analog down mixer in combination with the power amplifier and analog to digital converter to improve the accuracy of phase detection.

The converted digital signal is passed to a hardware accelerator 14 and further filtered and decimated 16 to 3× symbol rate, e.g. 576 kHz. This signal first passes a Carrier Recovery block 18 and then a Rotator block 20 and then to a storage register 22 which for the embodiment disclosed herein is a dual or A/B register. The function of Carrier Recovery block is to detect the burst and estimate carrier frequency offset between received and transmitted signals. This allows the following Rotator block to compensate the carrier offset. This rotated signal is then passed to a DSP 24 with an Equalizer 26. An adaptive decision-directed equalizer is applied where the training sequence is the unique word (UW) in the burst. Therefore an accurate position of UW is required. This information is acquired via a correlation block 28. The input data is correlated with UW and therefore, after the peak of the correlation result is detected, the UW location in the burst data can be determined. This process, typically known as conventional coherent detection, is employed in the disclosed embodiment even though the base-band modulation is DQPSK.

As for every coherent demodulator, the recovery of the carrier is most crucial. Its quality impacts the performance of the function blocks at later stages. The most widely used carrier frequency recovery scheme is automatic frequency control (AFC). However in the PHS system, the data is transmitted in burst mode, therefore the response time for AFC to be stable is relatively short, normally within a few to tens of symbols. Therefore open-loop carrier frequency estimation is employed in the present invention. Slow tracking circuitry is then applied to follow the slow varying carrier characteristics.

In the coherent demodulation of PSK signals, carrier frequency offset due to either limited oscillator precision or the Doppler effect caused by moving vehicles, can cause a significant loss in performance. In the PHS system, the system base station or cell station (CS) may have offset of up-to ±2 ppm and mobile or personal station (PS) may have offset of up-to ±5 ppm. Correcting the frequency offset in such demodulation will help improve receiver performance and relieve the stringent accuracy requirements on an oscillator and therefore reduce cost.

The Carrier Recovery block of the PHS employing the present invention has two basic functions, one is to detect a TDD (time division duplex) burst and the other is to estimate the carrier frequency offset between the received and the transmitted signal. This estimated carrier offset is employed either to drive a rotator to compensate the offset in received signal or to drive an AFC to correct frequency of the local carrier generator.

For a TDD system like PHS, the synchronization between PS and CS is extremely important as the first step in building the communication link. When the system is powered on for the first time, there is no timing information whatsoever. It is the PS's task to seek the timing information from the received air signal. Therefore for PS to acquire the timing information from CS, it needs to search for the proper indication. In PHS, the preamble signal (PR) in the control slot has appropriate characteristics to be used to detect such a burst (or slot).

Figure 2:
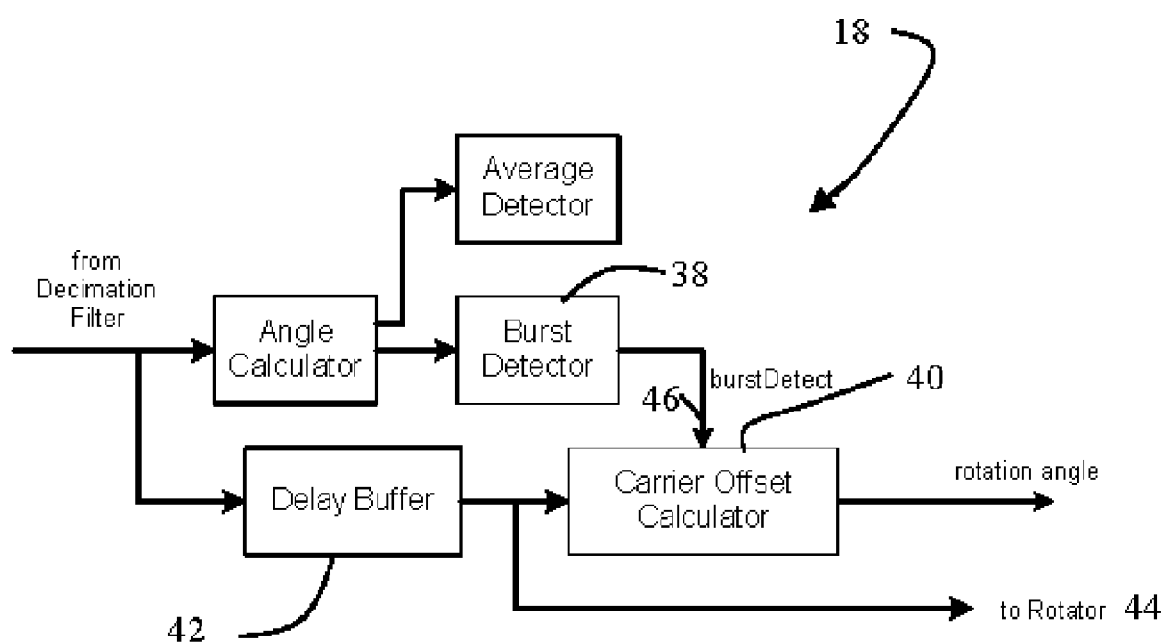
FIG. 2 is a block diagram of the elements of a carrier recovery system incorporating the present invention; and, FIG. 3 is a block diagram of the elements of a sliding window sum according to the present invention.

As shown in FIG. 2, Carrier Recovery block 18 consists of a Burst Detector (BD) 38 and a Carrier Offset Calculator (COC) 40. The burst detect flag 46 from BD will trigger the signals from the delay buffer 42, incorporating the present invention as described in greater detail subsequently, to pass to the COC to derive the carrier offset frequency. The resulting offset is transformed to a rotation angle to pass to Rotator 44 so that the frequency offset can be compensated in the received signals.

The embodiment shown employs a CORDIC (coordinate rotation digital computer) algorithm for angle calculation in the embodiment disclosed. CORDIC is an iterative solution for a wide range of functions, such as sin, cosine, tangent, arctangent, vector magnitude, etc. It is best known for its hardware implementation efficiency since it only uses shifts and adds instead of multiplications. An exemplary CORDIC processor used in embodiment described herein is disclosed in copending application Ser. No. 60/648,762, entitled PRECISION CORDIC PROCESSOR filed on Jan. 31, 2005, the disclosure of which is incorporated herein by reference as though fully set forth.

The CORDIC angle calculator receives the I and Q data from the decimation filter and incorporates the scaling function for the input. The scaling function incorporates a shift register to shift the I and Q data and provides a shift bits output which is employed in re-scaling the amplitude output.

The carrier offset calculator 40 of FIG. 2 employs the open-loop carrier offset estimation algorithm used in PHS for carrier recovery. The algorithm makes use of the characteristics of the PR signal in the PHS system and directly estimates the carrier offset introduced by the oscillator and Doppler shift.

The carrier offset calculator is triggered by the burst detection flag 46. I/Q data is entered into delay buffer 42. The delay buffer employs the sliding window summing arrangement of the present invention for more efficient storage.

The desired operation of the delay line registers for which the present invention is employed is as follows:

$$y(n) = \sum_{i=0}^{15} x(n-1)$$

The bit-width of x(i) is 25 bits. This equation is typically modified in common practice to y(n)=(y(n−1)+x(n)−x(n−15). Therefore using conventional delay line configurations 29 bits would be required to save y(n) and a depth of 16 delay line. The storage requirement is nominally calculated at 16*29=464 bits.

The present invention implements dynamic scaling to keep the delay line at the least number of bits possible. Therefore the delay for x(n−i) is 12 bits in width, while the new input x(n) is of 25 bits. Hence we have the following equation, $$y(n)=y(n-1)_{29bit}+x(n)_{25bit}-[x(n-15_{12bit}<<(12-s(n-15))],$$

where "<<" and ">>" mean left and right shift, respectively. The effective bit-width of x(n) is determined and saved into a delay line before x(n) goes into the delay line.

If the actual width of x(n) is only 16 bits, 4 bits will be shifted out before x(n) is stored in the delay line. Then when x(n) is called to be added in the accumulator, it will left shift 4 bits to restore to 16 bits. Here the stored number of shift bits is 4. Therefore the delay line is accompanied by a delay line for the number of shift bits. This can reduce the storage from 16*29=464 bits to 16*(12+4)=256 bits while maintaining the necessary precision of the input.

Figure 3:
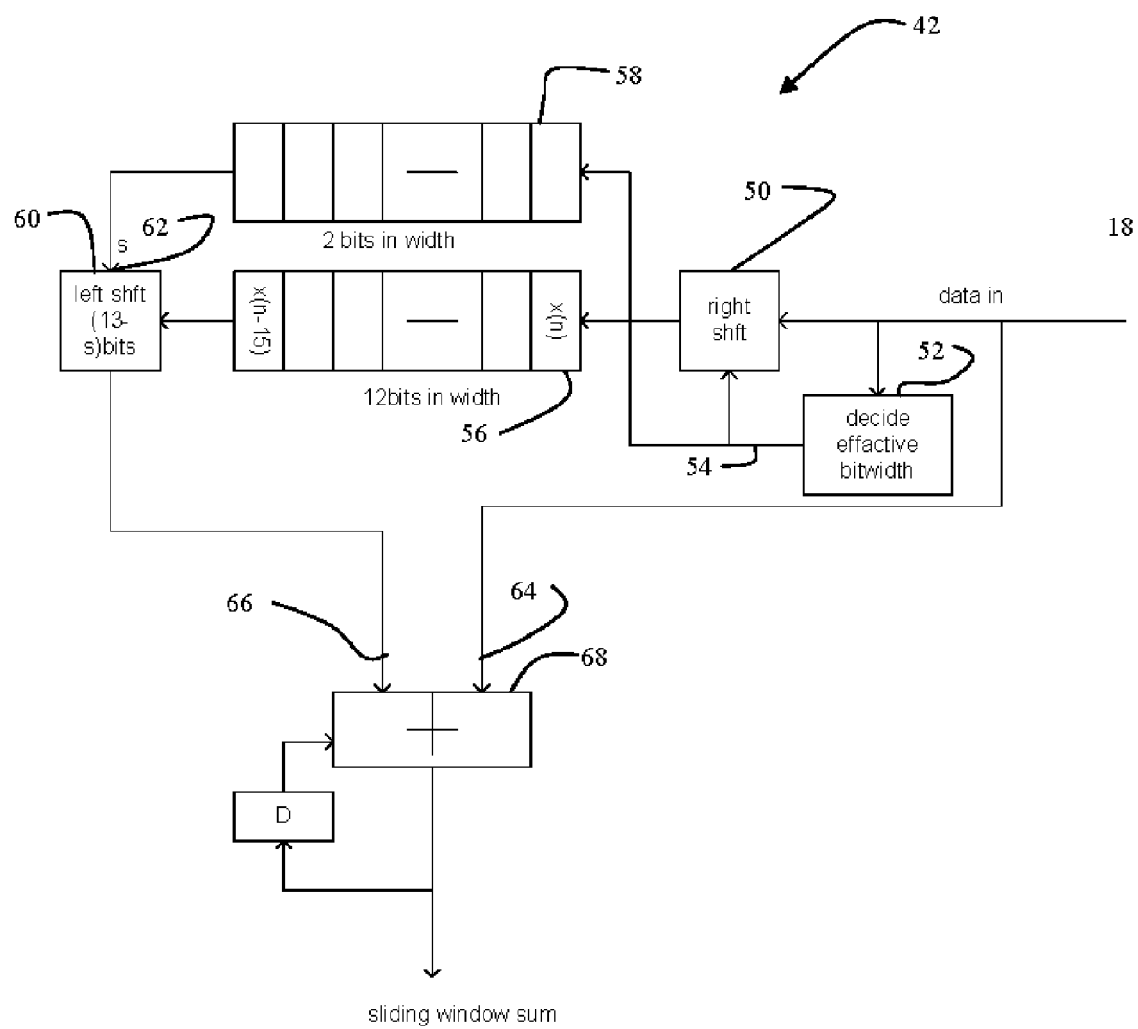

As shown in FIG. 3, the input data from the decimation filter is provided to a shift register 50 and operated on by an effective bit width determination function 52 which provides a two bit shift value output 54 to right shift register 50 by that value. A first delay line of 12 bit width 56 receives the shifted value from register 50 while a second delay line of 2 bit width 58 receives the two bit shift value 54. At the output of the first delay line 56 second shift register 60 receives the 12 bit width data and the two bit shift value at a shift input 62 to left shift by that value.

Current data 64 and delayed data 66 combined in the summer 68 are provided as input to the carrier offset calculator of FIG. 2 which determines the rotation angle and directly to a rotator for correction of the demodulated signal.

Figure 4:
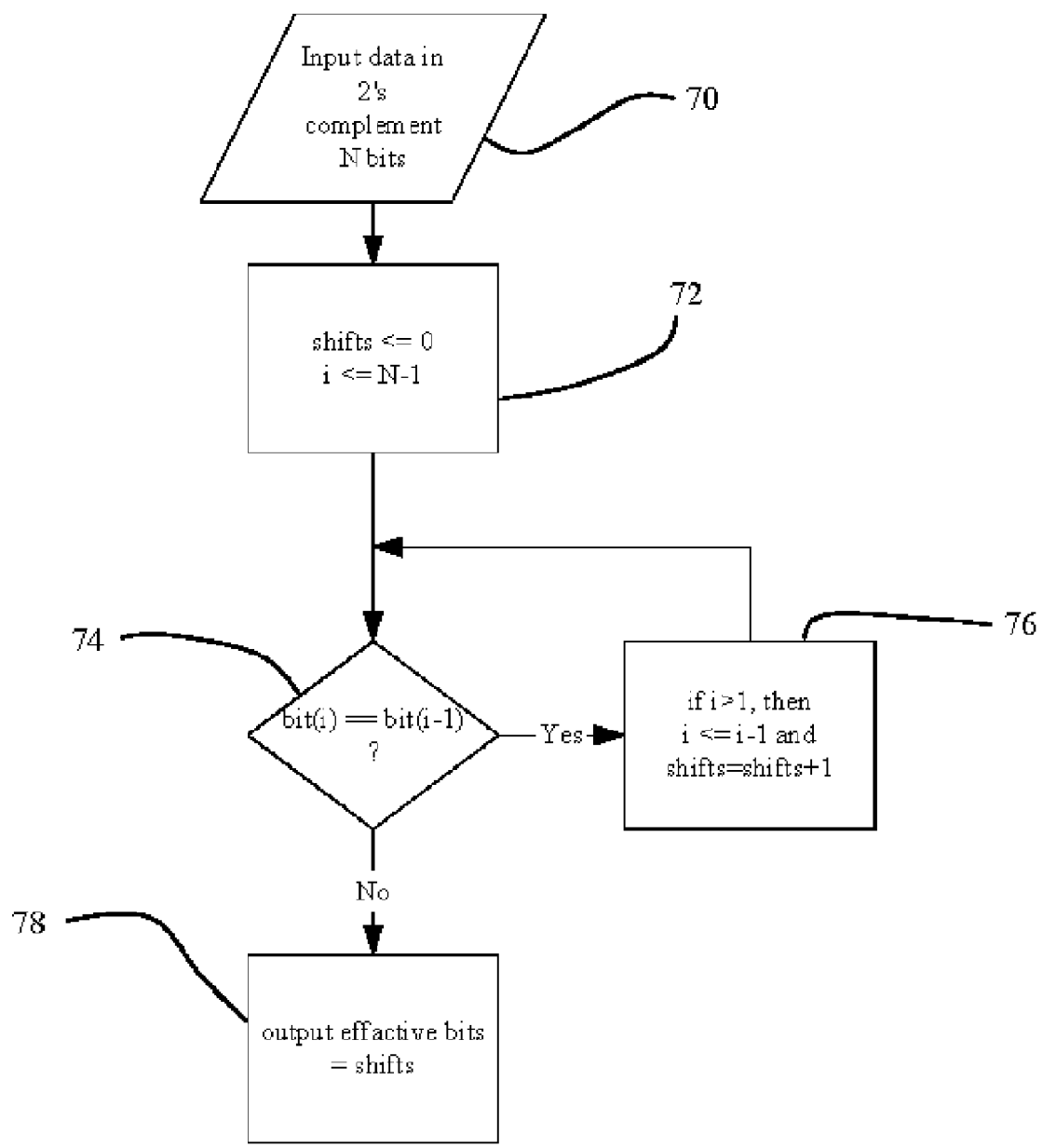
FIG. 4 illustrates the steps of a method for determining bit width.

FIG. 4 shows in detail the operation of the bit-width determination function 52. Input data is evaluated in 2s complement form for N bits in step 70. The shift value is defined as 0 and an index, i, is set to N−1 in step 72. The data is then evaluated to determine if the bit corresponding to the index, i, is equal to the bit corresponding to the index minus 1, i−1, in step 74. If bit i is not equal to bit i−1, the current shift value is output and determines the effective bit width. If bit i is equal to bit i−1, then if the index is greater than 1 it is decremented (i<=i−1) and the value of shifts is incremented by one (shifts=shifts+1) in step 76 and the comparison of step 74 is repeated.

Having now described the invention in detail as required by the patent statutes, those skilled in the art will recognize modifications and substitutions to the specific embodiments disclosed herein. Such modifications are within the scope and intent of the present invention as defined in the following claims.

What is claimed is:

1. A delay buffer comprising:
a first shift register receiving input data and having a shift signal input port, the first shift register operable to shift the input data responsive to a shift signal on the shift signal input port;
means for determining an effective bit width of the input data, said determining means providing a shift signal to the first shift register shift signal input port;
a first delay line receiving the shifted data from the first shift register;
a second delay line of equal length to the first delay line receiving the shift signal; and
a second shift register receiving the output from the first delay line and having a shift signal input port receiving the output of the second delay line, the second shift register shifting the data contained therein according to the shift signal.

2. A delay buffer as defined in claim 1 wherein the input data is 29 bits and the first delay line is 12 bits in width and the shift signal is two bits.

3. A delay as defined in claim 1 further comprising a summer receiving the input data and connected to the second shift register to receive the data contained therein after shifting.

4. A delay buffer as defined in claim 1 wherein the means for determining effective bit width comprises:
   means for converting the input data to 2s complement format;
   means for defining an initial shift value;
   means for defining an index value of the number of bits of the input data minus 1;
   means for comparing the value of an input data bit corresponding to the index value to an input data bit corresponding the index value minus 1;
   means for incrementing the index and shift values upon a positive compare from the comparing means and
   means for outputting the shift value upon a negative compare from the comparing means.

* * * * *